United States Patent
Huang

(10) Patent No.: US 10,068,837 B1
(45) Date of Patent: Sep. 4, 2018

(54) UNIVERSAL PREFORMED LEAD FRAME DEVICE

(71) Applicant: Chang Wah Technology Co., Ltd., Kaohsiung (TW)

(72) Inventor: Chia-Neng Huang, Kaohsiung (TW)

(73) Assignee: Chang Wah Technology Co., LTD., Kaohsiung (TW)

( * ) Notice: Subject to any disclaimer, the term of this patent is extended or adjusted under 35 U.S.C. 154(b) by 0 days.

(21) Appl. No.: 15/805,086

(22) Filed: Nov. 6, 2017

(30) Foreign Application Priority Data

Jun. 20, 2017 (TW) .............................. 106208888 U

(51) Int. Cl.
*H01L 23/48* (2006.01)
*H01L 23/495* (2006.01)
*H01L 21/48* (2006.01)

(52) U.S. Cl.
CPC .. *H01L 23/49503* (2013.01); *H01L 23/49548* (2013.01); *H01L 23/49558* (2013.01); *H01L 21/4828* (2013.01)

(58) Field of Classification Search
CPC ......... H01L 23/00; H01L 23/31; H01L 23/48; H01L 23/495; H01L 23/562; H01L 23/49503; H01L 23/49537; H01L 23/4952; H01L 23/49586; H01L 23/49838; H01L 23/49541; H01L 23/3121; H01L 23/49548; H01L 23/49558

USPC ......................................................... 257/676
See application file for complete search history.

(56) References Cited

U.S. PATENT DOCUMENTS

| | | | | |
|---|---|---|---|---|
| 2003/0082854 A1* | 5/2003 | Kasahara | ............ | H01L 21/4839 438/123 |
| 2006/0244131 A1* | 11/2006 | Kobayashi | ............ | H01L 23/552 257/724 |
| 2013/0299960 A1* | 11/2013 | Chan | ..................... | H01L 33/642 257/706 |
| 2016/0043019 A1* | 2/2016 | Huang | .............. | H01L 23/49513 174/257 |

* cited by examiner

*Primary Examiner* — Chuong A Luu
(74) *Attorney, Agent, or Firm* — DLA Piper LLP (US)

(57) ABSTRACT

A universal preformed lead frame device includes a plurality of spaced-apart longitudinal and transverse sections, and a plurality of preformed lead frame units each surrounded by two adjacent ones of the longitudinal and transverse sections and each includes a die pad, a plurality of spaced-apart leads, and a molding layer. The die pad includes a bottom portion, a die support portion and a plurality of spaced-apart pillar portions extending upwardly from the bottom portion. The leads extend from the two adjacent ones of the longitudinal and transverse sections toward the die pad. The molding layer is made of a polymeric material and fills gaps formed among the die support portion, the pillar portions, and the leads.

9 Claims, 6 Drawing Sheets

UNIVERSAL PREFORMED LEAD FRAME DEVICE

CROSS-REFERENCE TO RELATED APPLICATION

This application claims priority of Taiwanese Utility Model Patent Application No. 106208888, filed on Jun. 20, 2017.

FIELD

The disclosure relates to a preformed lead frame device, and more particularly to a universal preformed lead frame device suitable for chips with different sizes.

BACKGROUND

Referring to FIG. 1, a conventional quad flat no-lead (QFN) lead frame includes an outer frame 11, a metallic die pad 12 surrounded by the outer frame 11, a connecting portion 13 connected between the metallic die pad 12 and the outer frame 11, and a plurality of spaced-apart leads 14 extending from the outer frame 11 toward the metallic die pad 12 in a spaced-apart manner. Referring to FIG. 2, when the conventional QFN lead frame is packaged, a chip 100 is first disposed on the metallic die pad 12, and then a plurality of wires 15 are connected between the metallic die pad 12 and the spaced-apart leads 14. Finally, the chip 100 and the outer frame 11 are covered by a polymeric encapsulating material, followed by curing the polymeric encapsulating material to form a polymeric encapsulating layer 16, and a chip package device is obtained.

However, considering that the operability of the packing process and poor adhesion strength between the polymeric encapsulating layer 16 and the metallic die pad 12 may adversely affect reliability and performance of the chip package device, a ratio of an area of a surface of the chip 100 attached to the metallic die pad 12 to an area of a surface of the metallic die pad 12 for disposing the chip 100 is controlled to lie within a range of 0.6 to 0.8. By way of maintaining the abovementioned ratio, heterogeneous interfaces between the polymeric encapsulating layer 16 and the metallic die pad 12 can be reduced. Nevertheless, when the size of the chip 100 to be disposed on the conventional QFN lead frame is changed, it is necessary to produce a new conventional QFN lead frame with the metallic die pad 12 having a size that matches the size of the chip 100 for maintaining the abovementioned ratio.

SUMMARY

Therefore, an object of the disclosure is to provide a universal preformed lead frame device that can alleviate at least one of the drawbacks of the prior art.

According to one aspect of the disclosure, the universal preformed lead frame device includes a plurality of spaced-apart longitudinal sections, a plurality of spaced-apart transverse sections intersecting the longitudinal sections, and a plurality of preformed lead frame units.

Each of the preformed lead frame units is surrounded by two adjacent ones of the longitudinal sections and two adjacent ones of the transverse sections, and includes a die pad, a plurality of spaced-apart leads, and a molding layer.

The die pad of each of the lead frame units includes a bottom portion, a die support portion that extends upwardly from the bottom portion and that has a top surface opposite to the bottom portion, a plurality of spaced-apart pillar portions that extend upwardly from the bottom portion and that surround the die support portion in a spaced apart manner, and a first gap that is formed among the die support portion and the pillar portions. Each of the pillar portions has a top surface opposite to the bottom portion.

The leads of each of the preformed lead frame units extend from the two adjacent ones of the longitudinal sections and the two adjacent ones of the transverse sections toward the die pad. Each of the leads of each of the preformed lead frame units has a top surface opposite to the bottom portion of the die pad. A second gap is formed among the die pad and the lead of each of the preformed lead frame units.

The molding layer of each of the preformed lead frame units is made of a polymeric material, and includes a first molding portion filling the first gap, a second molding portion surrounding the pillar portions and the first molding portion, and a third molding portion filling the second gap. The first molding portion includes a first surface opposite to the bottom portion of the die pad. The second molding portion includes a second surface opposite to the bottom portion of the die pad. The top surfaces of the die support portion and the pillar portions are flush with the first surface of the first molding portion. The first surface of the first molding portion and the second surface of the second molding portion are different in height.

According to another aspect of the disclosure, a universal preformed lead frame device includes a plurality of spaced-apart longitudinal sections, a plurality of spaced-apart transverse sections intersecting the longitudinal sections, and a plurality of preformed lead frame units.

Each of the preformed lead frame units is surrounded by two adjacent ones of the longitudinal sections and two adjacent ones of the transverse sections, and includes a die pad, a plurality of spaced-apart leads, and a molding layer.

The die pad of each of the preformed lead frame units includes a bottom portion, a die support portion that extends upwardly from the bottom portion and has a top surface opposite to the bottom portion, a plurality of spaced-apart pillar portions that extend upwardly from the bottom portion and that surround the die support portion in a spaced apart manner.

The leads of each of the preformed lead frame units extends from the two adjacent ones of the longitudinal sections and the two adjacent ones of the transverse sections toward the die pad.

The molding layer of each of the preformed lead frame units is made of a polymeric material and fills gaps formed among the die support portion, the pillar portions, and the leads.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
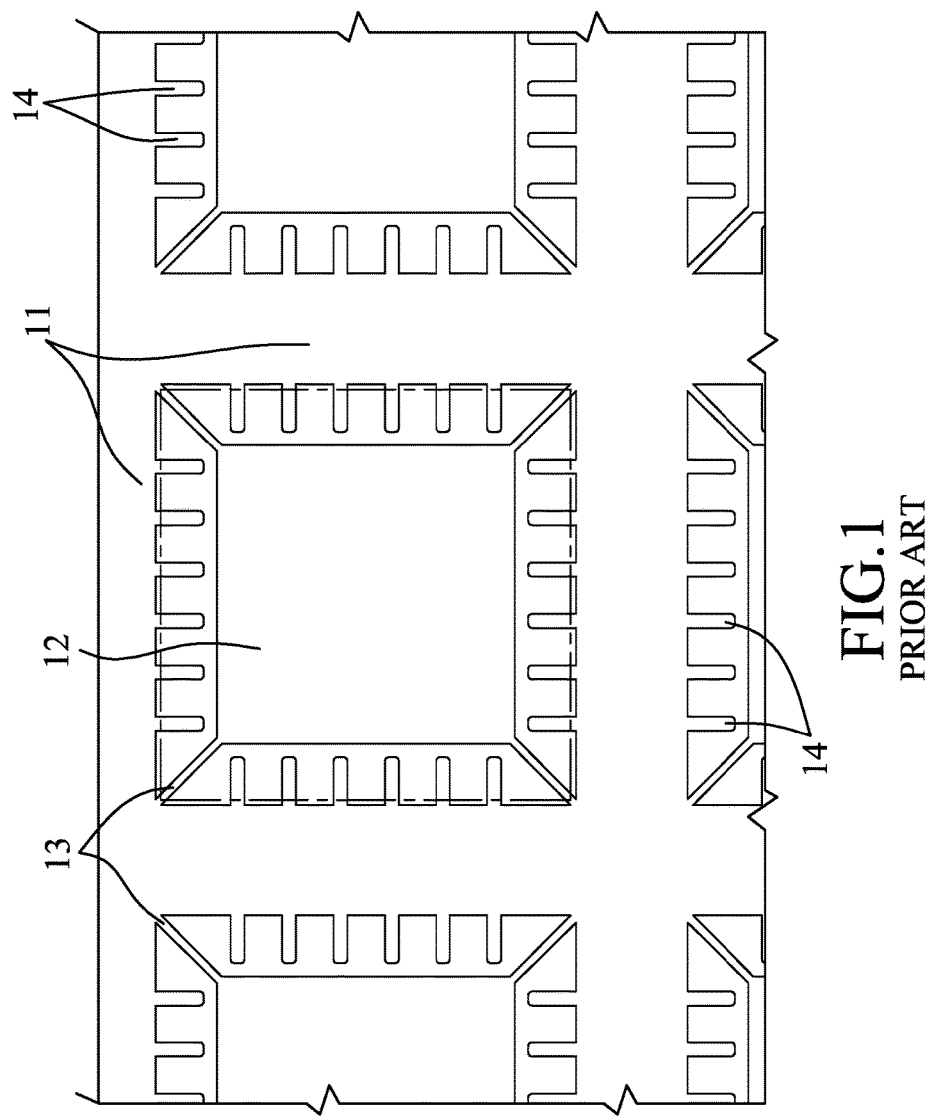
FIG. 1 is a fragmentarily top view illustrating a conventional quad flat no-lead (QFN) lead frame.
Figure 2:
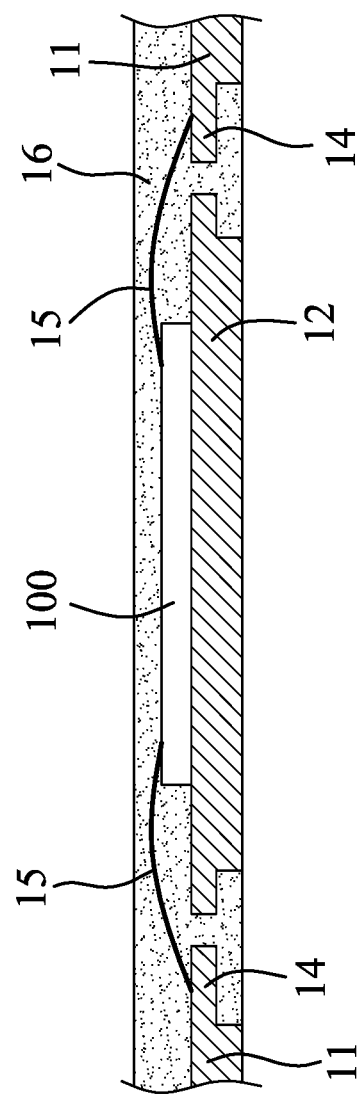
FIG. 2 is a fragmentarily schematic view of a chip package device including the conventional QFN lead frame of FIG. 1.
Figure 3:
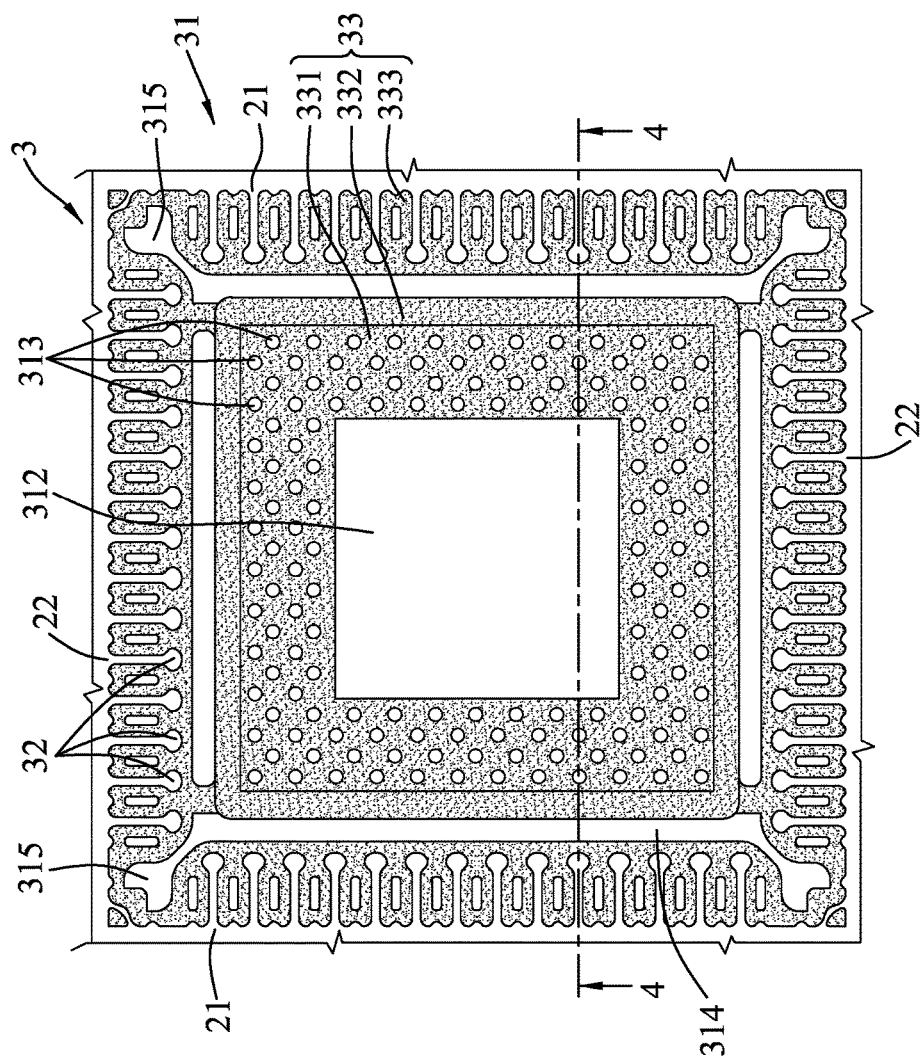
FIG. 3 is a fragmentarily top view illustrating an embodiment of a universal preformed lead frame device according to the disclosure.
Figure 4:
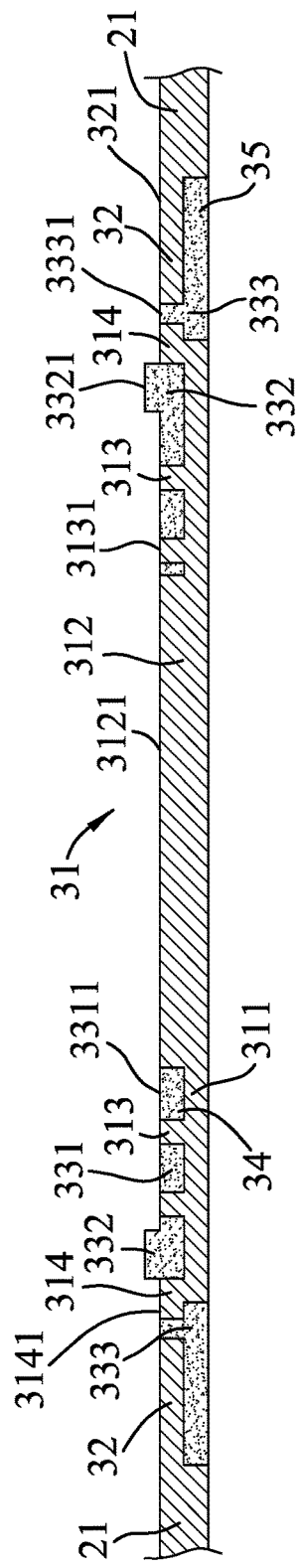
FIG. 4 is a fragmentarily cross-sectional view taken alone line 4-4 of the FIG. 3.

Referring to FIGS. 3 and 4, an embodiment of a universal preformed lead frame according to the disclosure is used for disposing at least one chip of variable size to form an integrated circuit package device. The embodiment of the universal preformed lead frame includes a plurality of spaced-apart longitudinal sections 21 and a plurality of spaced-apart transverse sections 22 intersecting the longitudinal sections 21, and a plurality of preformed lead frame units 3. Each of the preformed lead frame units 3 is surrounded by two adjacent ones of the longitudinal sections 21 and two adjacent ones of the transverse sections 22.

In FIG. 3, only two adjacent spaced-apart longitudinal sections 21, two adjacent spaced-apart transverse sections 22 intersecting therewith, and one preformed lead frame unit 3 are shown.

The preformed lead frame unit 3 includes a die pad 31, a plurality of spaced-apart leads 32, and a molding layer 33.

The die pad 31 of the preformed lead frame unit 3 includes a bottom portion 311, a die support portion 312 that extends upwardly from the bottom portion 311 and that has a top surface 3121 opposite to the bottom portion 311, a plurality of spaced-apart pillar portions 313 that extend upwardly from the bottom portion 311 and that surround the die support portion 312 in a spaced apart manner.

The molding layer 33 is made of a polymeric material and fills gaps formed among the die support portion 312, the pillar portions 313, and the leads 32.

In one form, each of the spaced-apart pillar portions 313 has a top surface 3131 opposite to the bottom portion 311. The die pad 31 further includes a first gap 34 that is formed among the die support portion 312 and the pillar portions 313.

In one form, the longitudinal and transverse sections 21, 22, the bottom portions 311, the die support portions 312 and the pillar portions 313 of the die pads 31 may be made from the same metal material. The die support portion 312 of the die pad 31 and the leads 32 of the preformed lead frame unit may be made from the same metal material. The leads 32 respectively extend from the two adjacent longitudinal sections 21 and the two adjacent transverse sections 22 toward the die pad 31. Each of the leads 32 has a top surface 321 opposite to the bottom portion 311 of the die pad 31 and is exposed externally. A second gap 35 is formed among the die pad 31 and the leads 32.

In one form, the preformed lead frame unit 3 may include two or more of the die pads 31 connected together.

In the embodiment, the die pad 31 of the preformed lead frame unit 3 further includes a ground portion 314 and a connecting portion 315. The ground portion 314 extends upwardly from the bottom portion 311 and is disposed between the pillar portions 313 and the leads 32. The connecting portion 315 extends from the die support portion 312 to the longitudinal sections 21 and the transverse sections 22 so as to interconnect the die support portion 312 and the longitudinal and transverse sections 21, 22. In the embodiment, the ground portion 314 is strip-shaped and has a top surface 3141 that is opposite to the bottom portion 311 and that is exposed externally from the molding layer 33.

Specifically, the molding layer 33 includes a first molding portion 331 that fills the first gap 34 formed among the die support portion 312 and the pillar portions 313, a second molding portion 332 that surrounds the pillar portions 313 and the first molding portion 331, and a third molding portion 333 that fills the second gap 35 formed among the die pad 31 and the leads 32.

The first molding portion 331 of the molding layer 33 includes a first surface 3311 opposite to the bottom portion 311 of the die pad 31. The second molding portion 332 of the molding layer 33 includes a second surface 3321 opposite to the bottom portion 311 of the die pad 31. The third molding portion 333 of the molding layer 33 includes a third surface 3331 opposite to the bottom portion 311 of the die pad 31. More specifically, the top surfaces 3121, 3131 of the die support portion 312 and the pillar portions 313 are flush with the first surface 3311. The first surface 3311 and the second surface 3321 are different in height. In the embodiment, the first surface 3311 is lower than the second surface 3321. The top surfaces 3121, 3131 of the die support portion 312 and the pillar portions 313, the first surface 3311 of the first molding portion 331, the second surface 3321 of the second molding portions 332 and the third surface 3331 of the third molding portion 333 are exposed externally and are available for subsequent processing steps together with the top surface 321 of the leads 32. The subsequent processing steps are, for example, mounting a chip on the die pad 31 and electrically connecting the chip to the leads 32.

According to the embodiment of the disclosure the die support portion 312 and the pillar portions 313 of the die pad 31 cooperatively serve as a chip-bearing region of the preformed lead frame unit 3 for mounting the chip of variable size. The die support portions 312 can be sized to have an area matching that of the chip which has a minimum size within a desired range of chip sizes. When the chip intended to be disposed has a size too large to be only supported by the die support portion 31, the pillar portions 313 are auxiliary to the die support portion 31 for mounting the chip. Therefore, the preformed lead frame unit 3 is suitable for mounting the chip of variable size. Furthermore, the first molding portion 331 is made from a polymeric material compatible with an encapsulating layer that is subsequently applied to the universal preformed lead frame device, thereby improving the adhesion between the encapsulating layer and the die pad 31. Therefore, a chip-packaged device including the universal preformed lead frame device, the chips and the encapsulating layer has desired reliability. In addition, since the second surface 3321 of the second molding portion 332 of the molding layer 33 is higher than that of the first surface 3311 of the first molding portion 331, the second molding portion 332 can serve as a retaining wall to prevent overflow of a conductive adhesive material (such as an Ag epoxy or an electrically conductive adhesive, etc.) used for connecting the chip to the chip-bearing region in the subsequent chip-mounting operation, thereby preventing the failure of the chip-package device.

Figure 5:
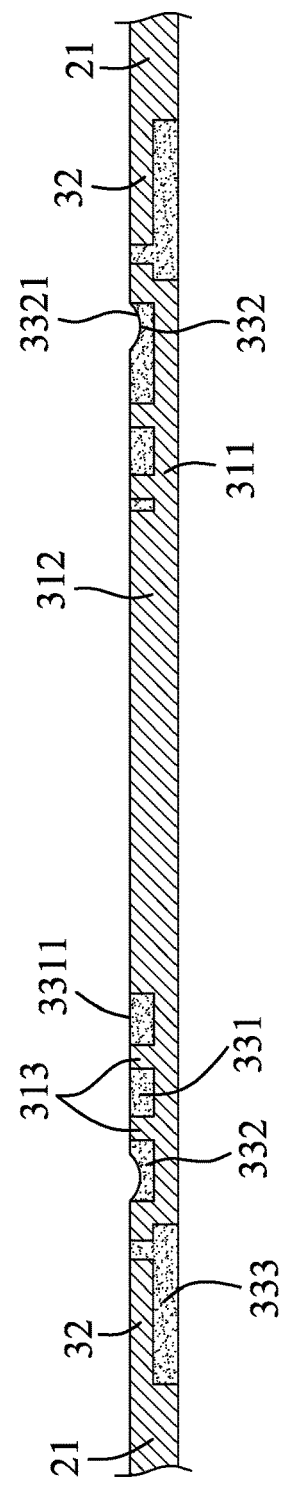
FIG. 5 is a fragmentarily cross-sectional view illustrating another configuration of the embodiment.

Referring to FIG. 5, another configuration of the embodiment of the universal preformed lead frame device is illustrated. Similar to FIGS. 3 and 4, only one of the preformed lead frame units 3 is shown. The first surface 3311 of the first molding portion 331 of the molding layer 33 is higher than that of the second surface 3321 of the second molding portion 332 of the molding layer 33. Thus, the second surface 3321 of the second molding portion 332 can serve as an overflow-receiving groove for receiving the overflow of the conductive adhesive material during the subsequent chip-mounting operation.

When the universal preformed lead frame device is manufactured, a substrate (not shown) that is made of a conductive material, such as copper, a copper-based alloy or an iron-nickel-based alloy, is first provided. The substrate is then defined with a plurality of spaced-apart longitudinal regions and a plurality of spaced-apart transverse regions arranged in an array of rows and columns.

The substrate is then patterned to remove an unnecessary portion using etching techniques so as to form a semi-finished product of the universal preformed lead frame device. The semi-finished product includes the spaced-apart longitudinal and transverse sections 21, 22, and a plurality of semi-finished preformed lead frame units. With reference to FIG. 3, each of the semi-finished preformed lead frame units is surrounded by two adjacent ones of the longitudinal sections 21 and two adjacent ones of the transverse sections 22, and includes the die pad 31 and the leads 32. The longitudinal sections 21 and the transverse sections 22 are connected to the bottom portions 311 of the die pads 31 of the preformed lead frame units 3.

Further referring to FIGS. 4 and 5, the semi-finished product is then disposed in a mold (not shown), and then an encapsulating material is filled in the first gaps 34 and the second gaps 35 without covering the die pads 31 and the leads 32, followed by curing of the encapsulating material, which is selected from insulating polymeric materials, e.g., epoxy resin, and so on, to form the molding layer 33. The universal preformed lead frame device partly shown in FIG. 3 is thus formed.

Figure 6:
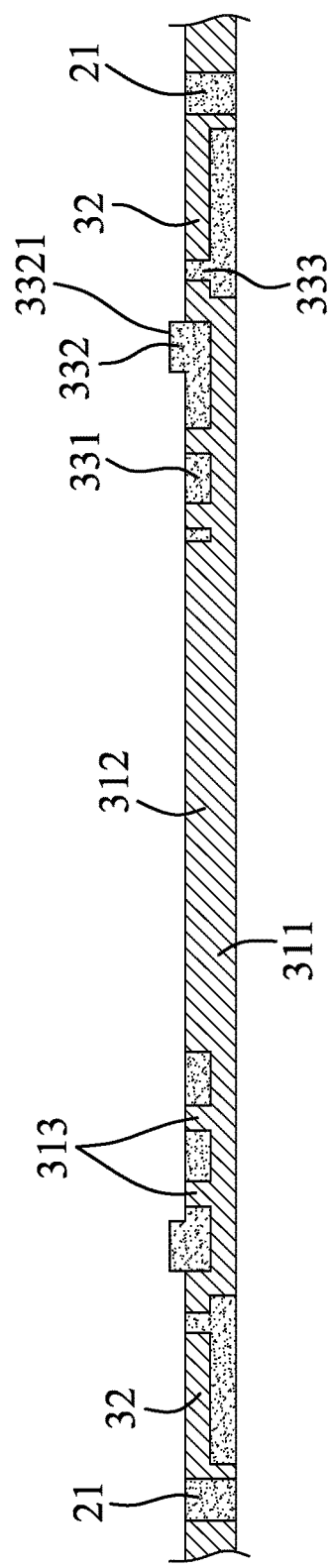
FIG. 6 is a fragmentarily cross-sectional view illustrating still another configuration of the embodiment.

Referring to FIG. 6, still another configuration of the embodiment of the universal preformed lead frame device is illustrated. The longitudinal and transverse sections 21, 22 are made of polymeric materials, and are integrally formed with the molding layers 33 of the preformed lead frame units 3. With this configuration, the connecting portions 315 shown in FIG. 3 for connecting the die pad 31 of each of the preformed lead frame units 3 to the two adjacent ones of the longitudinal and transverse sections 21, 22 may be dispensed.

Furthermore, with the configuration of FIG. 6, the longitudinal and transverse sections 21, 22 made of the polymeric materials can serve as cutting paths. The chip-package device including the universal preformed lead frame device of the disclosure, the chips and the encapsulating layer can be diced along the cutting paths formed in the longitudinal and transverse sections 21, 22, thereby improving the efficiency of the dicing process.

The configuration of the universal preformed lead frame shown in FIG. 6 can be manufactured using semi-etching techniques. Since the semi-etching techniques are known in the art, such as those disclosed in Taiwanese Utility Model Patent Publication No. M523189, further details thereof are omitted herein for the sake of brevity.

By virtue of the inclusion of the pillar portions 313 of the die pads 31 and the first molding portions 331 of the molding layers 33, the die pads 31 of the preformed lead frame units 3 of the universal preformed lead frame device of the disclosure are applicable to be disposed with chips of various sizes, and adhesion of the encapsulating layer to the die pads 31 can be improved so as to enhance the encapsulation reliability of the chip-package device subsequently formed. In addition, the overflow of the conductive adhesive material for interconnecting the chips and the die-bearing portion can be prevented by the design of the second molding portions 332 of the molding layers 33.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A universal preformed lead frame device, comprising:
   a plurality of spaced-apart longitudinal sections;
   a plurality of spaced-apart transverse sections intersecting said longitudinal sections; and
   a plurality of preformed lead frame units, each of said preformed lead frame units surrounded by two adjacent ones of said longitudinal sections and two adjacent ones of said transverse sections and including:
      a die pad that includes a bottom portion, a die support portion that extends upwardly from said bottom portion and that has a top surface opposite to said bottom portion, a plurality of spaced-apart pillar portions that extend upwardly from said bottom portion and that surround said die support portion in a spaced apart manner, and a first gap that is formed among said die support portion and said pillar portions, each of said pillar portions having a top surface opposite to said bottom portion;
      a plurality of spaced-apart leads extending from said two adjacent ones of said longitudinal sections and said two adjacent ones of said transverse sections toward the die pad, each of said leads having a top surface opposite to said bottom portion of said die pad, wherein a second gap is formed among said die pad and said leads; and
      a molding layer made of a polymeric material and including a first molding portion filling said first gap, a second molding portion surrounding said pillar portions and said first molding portion, and a third molding portion filling said second gap,
   wherein said first molding portion includes a first surface opposite to said bottom portion of said die pad, said second molding portion including a second surface opposite to said bottom portion of said die pad, said top surfaces of said die support portion and said pillar portions being flush with said first surface of said first molding portion, said first surface of said first molding portion and said second surface of said second molding portion being different in height.

2. The universal preformed lead frame device of claim 1, wherein said die pad and said leads being made from a same metal material.

3. The universal preformed lead frame device of claim 1, wherein said first surface of said first molding portion of said molding layer of each said preformed lead frame unit is higher than that of said second surface of said second molding portion of said molding layer.

4. The universal preformed lead frame device of claim 1, wherein said first surface of said first molding portion of said molding layer of each said preformed lead frame unit is lower than said second surface of said second molding portion of said molding layer.

5. The universal preformed lead frame device of claim 1, wherein said third molding portion of said molding layer of each of said preformed lead frame units has a third surface opposite to said bottom portion of said die pad, said third surface being flush with said first surface of said first molding portion of said molding layer.

6. The universal preformed lead frame device of claim 1, wherein said die pad of each of said preformed lead frame units further includes a ground portion extending upwardly from said bottom portion, and disposed between said pillar portions and said leads, said ground portion having a top surface opposite to said bottom portion and being exposed from said molding layer.

7. The universal preformed lead frame device of claim 1, wherein said longitudinal sections, said transverse sections and said die pads of said preformed lead frame units are made of a same metal material, said longitudinal sections and said transverse sections being connected to said bottom portions of said die pads of said preformed lead frame units.

8. The universal preformed lead frame device of claim 1, wherein said longitudinal sections and said transverse sections are made from a polymeric material and are integrally formed with said molding layer.

9. A universal preformed lead frame device, comprising:
a plurality of spaced-apart longitudinal sections;
a plurality of spaced-apart transverse sections intersecting said longitudinal sections; and
a plurality of preformed lead frame units, each of said preformed lead frame units being surrounded by two adjacent ones of said longitudinal sections and two adjacent ones of said transverse sections and including:
a die pad that includes a bottom portion, a die support portion that extends upwardly from said bottom portion and that has a top surface opposite to said bottom portion, a plurality of spaced-apart pillar portions that extend upwardly from said bottom portion and that surround said die support portion in a spaced apart manner;
a plurality of spaced-apart leads extending from said two adjacent ones of said longitudinal sections and said two adjacent ones of said transverse sections toward said die pad; and
a molding layer made of a polymeric material and filling gaps formed among said die support portion, said pillar portions, and said leads.

* * * * *